(12) United States Patent
Crandall et al.

(10) Patent No.: US 10,767,383 B2
(45) Date of Patent: Sep. 8, 2020

(54) GROUND WIRE GUIDANCE SYSTEM FOR ROBOTIC VEHICLE WITH DOORWAY ACCESS

(71) Applicants: Justin Crandall, Dallas, TX (US); Bart M. Lomont, Dallas, TX (US); David J. Melbourne, Arlington, TX (US)

(72) Inventors: Justin Crandall, Dallas, TX (US); Bart M. Lomont, Dallas, TX (US); David J. Melbourne, Arlington, TX (US)

(73) Assignee: Robin Technologies, Inc., Dallas, TX (US)

(*) Notice: Subject to any disclaimer, the term of this patent is extended or adjusted under 35 U.S.C. 154(b) by 212 days.

(21) Appl. No.: 16/050,256

(22) Filed: Jul. 31, 2018

(65) Prior Publication Data
US 2019/0138025 A1 May 9, 2019

Related U.S. Application Data

(60) Provisional application No. 62/582,496, filed on Nov. 7, 2017, provisional application No. 62/582,488, filed on Nov. 7, 2017.

(51) Int. Cl.
| | |
|---|---|
| *E04H 6/42* | (2006.01) |
| *E05B 65/00* | (2006.01) |
| *E05B 47/00* | (2006.01) |
| *E05F 15/76* | (2015.01) |
| *E05F 15/79* | (2015.01) |

(Continued)

(52) U.S. Cl.
CPC .......... *E04H 6/422* (2013.01); *A01D 34/008* (2013.01); *E04H 6/426* (2013.01); *E05B 47/00* (2013.01); *E05B 65/0021* (2013.01); *E05F 15/76* (2015.01); *E05F 15/79* (2015.01); *G01R 33/0206* (2013.01); *G01V 3/081* (2013.01); *G05D 1/0265* (2013.01); *E05B 2047/0067* (2013.01); *E05Y 2400/445* (2013.01); *E05Y 2900/106* (2013.01); *G05D 2201/0208* (2013.01)

(58) Field of Classification Search
CPC ............................. E04H 6/422; G05D 1/0265
See application file for complete search history.

(56) References Cited

U.S. PATENT DOCUMENTS 3,617,962 A * 11/1971 Wilson ................. B65G 47/496
335/151
3,933,099 A * 1/1976 Sieb ..................... G05D 1/0265
104/88.04

(Continued)

OTHER PUBLICATIONS

WIPO International Search Report in corresponding PCT patent application PCT/US2019/043592 filed on Jul. 26, 2019.

*Primary Examiner* — Thomas Ingram
*Assistant Examiner* — Omar K Morsy
(74) *Attorney, Agent, or Firm* — Dan Brown Law Office; Daniel R. Brown

(57) ABSTRACT

A ground wire guidance system for guiding a robotic vehicle through a doorway in a barrier. The system includes a ground wire loop arranged to pass though the doorway in two directions. Plural wires are switched as the loop passes through the doorway such that the pairs of wires conducting are spaced apart, or shielded, such that the robotic vehicle can reliably navigate through a relatively narrow doorway, while one of the wires passes through a central portion of the doorway.

20 Claims, 5 Drawing Sheets

(51) Int. Cl.
    *G01V 3/08*     (2006.01)
    *G05D 1/02*     (2020.01)
    *G01R 33/02*     (2006.01)
    *A01D 34/00*     (2006.01)

(56) References Cited

U.S. PATENT DOCUMENTS

| | | | | |
|---|---|---|---|---|
| 4,168,760 | A * | 9/1979 | Paul, Jr. | G05D 1/0265 |
| | | | | 104/245 |
| 4,777,785 | A * | 10/1988 | Rafaels | A01D 34/008 |
| | | | | 56/10.2 A |
| 5,023,790 | A | 6/1991 | Luke, Jr. | |
| 8,532,822 | B2 * | 9/2013 | Abramson | A01D 34/008 |
| | | | | 250/559.29 |
| 8,938,318 | B2 * | 1/2015 | Bergstrom | A01D 34/008 |
| | | | | 700/258 |
| 8,965,561 | B2 | 2/2015 | Jacobus et al. | |
| 9,788,480 | B2 | 10/2017 | Nafziger et al. | |
| 2015/0328775 | A1 * | 11/2015 | Shamlian | G05D 1/0234 |
| | | | | 700/258 |

* cited by examiner

GROUND WIRE GUIDANCE SYSTEM FOR ROBOTIC VEHICLE WITH DOORWAY ACCESS

RELATED APPLICATIONS

This disclosure claims priority to U.S. provisional patent application Ser. No. 62/582,488 filed on Nov. 7, 2017 and U.S. provisional patent application Ser. No. 62/582,496 filed on Nov. 7, 2017.

BACKGROUND OF THE INVENTION

Field of the Invention

The present disclosure generally relates to systems and methods for implementing an in-ground perimeter wire system that permits certain vehicles, including robotic lawnmowers, to pass through barriers, and including barrier door access control.

Description of the Related Art

In housing and business developments, a properly-kept lawn is desirable, can increase property values, and may actually be required under various association rules. Maintaining a grass lawn requires frequent mowing. Lawn mowing has traditionally been conducted by various types of powered and unpowered lawnmowers. In recent years, robotic mowers have been increasingly utilized by homeowners, renters, governments, business owners, and property owners. Robotic mowers automatically mow one or more sections of grass. Robotic mowers are controlled by a guidance system, and are programmable according to certain schedules, functions, and lawn areas. Different lawn areas may be separated from each other by a physical barrier, such as walls, fences, hedgerows, and such, which have an opening therein through which a robotic mower may pass. Commonly, such an opening, or doorway, may includes a door or gate that is installed to limit access for people, animals, debris, and for general security purposes.

Existing robotic mower guidance systems typically require the opening to be substantially wider than the robotic mower itself, to enable effective guidance of the robotic mower through the opening, given that the guidance may not be as precise as desired. A wider opening accommodates deviation of the robotic mower from an idealized pathway. A wider opening necessarily requires a wider, and generally bigger and heavier, door. Opening and closing a bigger door takes more time, which can be a security concern for pets, children, and property. Typically, in order to automate the lawn mowing process, the doors are opened and closed using motors, and bigger and heavier doors require stronger and heavier hardware, such as hinges, bolts, and the like, and also require larger and more energy consuming motors to operate them.

Thus, it can be appreciated that there is a need in the art for systems and methods for overcoming the aforementioned problems in the prior art for addressing doorway and door width requirements as they relate to robotic mower guidance, or for guidance of other vehicle types. Note that the description provided in this Background section should not be assumed to be prior art merely because it is mentioned in or associated with this Background section. This Background section may include information that describes one or more aspects of the subject technology.

SUMMARY OF THE INVENTION

The need in the art is address by the teachings of the present disclosure. The present disclosure teaches a ground wire guidance system for guiding a robotic vehicle through a doorway in a barrier. The system includes a ground wire loop arranged to pass though the doorway in both a first direction and a second direction. The ground wire arranged in the first direction is split adjacent the doorway with a first end coupled to a first switch and a second end coupled to a second switch. The ground wire arranged in the second direction is also split adjacent the doorway with a third end connected to a third switch and a fourth end connected to a fourth switch. A first and second wire are each connected between the first and second switch. The first wire is routed through a central portion of the doorway, and the second wire is routed through the doorway in a manner that enables reliable navigation by the robotic vehicle along the first wire. A third and fourth wire are each connected between the third switch and the fourth switch. The fourth wire is routed through a central portion of the doorway, and the third wire is routed through the doorway in a manner that enables reliable navigation by the robotic vehicle along the third wire. A controller is coupled to all of the switches to switch between a default state and a switched state. The default state couples the first wire between the first and second switches, and couples the third wire between the third and fourth switches. The switched state couples the second wire between the first and second switches, and couples the fourth wire between the third and fourth switches. This arrangement provides that only a single one of the second wire and the third wire is connected to the ground wire loop in either of the default state or the switched state.

In a specific embodiment of the foregoing system, the first and fourth wires are routed through the doorway a distance away from the central portion of the doorway, which that is selected to provide a minimum separation required for reliable navigation by the robotic vehicle. In another specific embodiment, the first and fourth wires are shielded to provide reliable navigation by the robotic vehicle along either of the second or third wires.

In a specific embodiment, the foregoing system further includes a sensor disposed adjacent the doorway that operates to detect an approaching vehicle, and outputs a detention signal to the controller. The controller, upon receipt of the detection signal, switches from the default state to the switched state. In a refinement to this embodiment, the controller reverts from the switched state back to the default stated after a predetermined period of time. In another refinement to this embodiment, where the robotic vehicle has a magnet fixed thereto, the sensor is a magnetometer responsive to the magnet in the robotic vehicle.

In a specific embodiment of the foregoing system, where a door is disposed within the doorway of the barrier, the system further includes a door latch sensor disposed adjacent the doorway, that detects an approaching vehicle, and unlocks a door locking mechanism on the door upon detection of the approaching vehicle. In a refinement to this embodiment, the door latch sensor outputs a door latch signal to the controller, and the controller changes the state of the first, second, third, and fourth switches in response to the door latch signal. In another refinement to this embodiment, the door latch signal is wirelessly communicated to the controller and to the door locking mechanism. In another specific embodiment of the foregoing system, the first, second, third, and fourth switches are single-pole, double-throw relays.

The present disclosure also teaches a method of guiding a robotic vehicle through a doorway in a barrier using a ground wire loop arranged to pass though the doorway in both a first direction and a second direction. The method includes splitting the ground wire arranged in the first direction adjacent the doorway and coupling a first switch to a first end thereof, and coupling a second switch to a second end thereof. Similarly, splitting the ground wire arranged in the second direction adjacent the doorway and coupling a third switch to a third end thereof, and coupling a fourth switch to a fourth end thereof. Then, connecting a first and second wire between the first and second switch, and routing the first wire through a central portion of the doorway, and routing the second wire through the doorway in a manner enabling reliable navigation by the robotic vehicle along the first wire. Additionally, connecting a third and fourth wire between the third and fourth switch, and routing the fourth wire through a central portion of the doorway, and routing the third wire through the doorway in a manner enabling reliable navigation by the robotic vehicle along the third wire. The method also includes coupling the first, second, third, and fourth switches to a controller, for switching between a default state and a switched state. The method includes activating the default state, thereby coupling the first wire between the first and second switches, and coupling the third wire between the third and fourth switches. Alternatively, activating the switched state, thereby coupling the second wire between the first and second switches, and coupling the fourth wire between the third and fourth switches. And thusly, providing that only a single one of the second wire and the third wire is connected to the ground wire loop in either of the default state or the switched state.

In a specific embodiment of the foregoing method the routing the first and fourth wires steps include routing through the doorway by selecting a distance away from the central portion of the doorway, and thereby providing provide a minimum separation from the second and third wires, respectively, for reliable navigation by the robotic vehicle.

In a specific embodiment, the foregoing method further includes shielding the first and fourth wires, thereby providing reliable navigation by the robotic vehicle along either of the second or third wires.

In a specific embodiment, the foregoing method further includes placing a sensor adjacent the doorway and detecting an approaching vehicle by the sensor, and outputting a detention signal, and, switching from the default state to the switched state in response to the detection signal. In a refinement to this embodiment, the method further includes reverting from the switched state back to the default stated after a predetermined period of time.

In a specific embodiment of the foregoing method, where a door with a door locking mechanism attached thereto is positioned within the doorway of the barrier, a door latch sensor is disposed adjacent the doorway, and the method further includes detecting an approaching vehicle by the door latch sensor, and unlocking the door locking mechanism upon detecting of the approaching vehicle. In a refinement to this embodiment, the method further includes outputting a door latch signal by the door latch sensor, and changing the state of the first, second, third, and fourth switches in response to the door latch signal.

The present disclosure also teaches a system for guiding a vehicle, including a plurality of switching wires, including a first switching wire, a second switching wire, a third switching wire, and a fourth switching wire, and, a plurality of switching devices, including a first switching device, a second switching device, a third switching device, and a fourth switching device. A perimeter wire is electrically connected to each of the plurality of switching devices, and a controller is electrically connected to each of the plurality of switching devices. And, the first switching wire and the second switching wire are electrically connected to each of the first switching device and the second switching device, and, the third switching wire and the fourth switching wire are electrically connected to each of the third switching device and the fourth switching device, and, the second switching wire and fourth switching wire extend away from the first switching wire and the third switching wire, respectively.

In a refinement to the foregoing embodiment, where the system is disposed about an opening in a barrier, the second switching wire and the fourth switching wire extend away from the first switching wire and the third switching wire, respectively, towards a central portion of the opening. In another refinement to this embodiment, a sensor is electrically connected to each of the plurality of switching devices.

DESCRIPTION OF THE INVENTION

Figure 1:
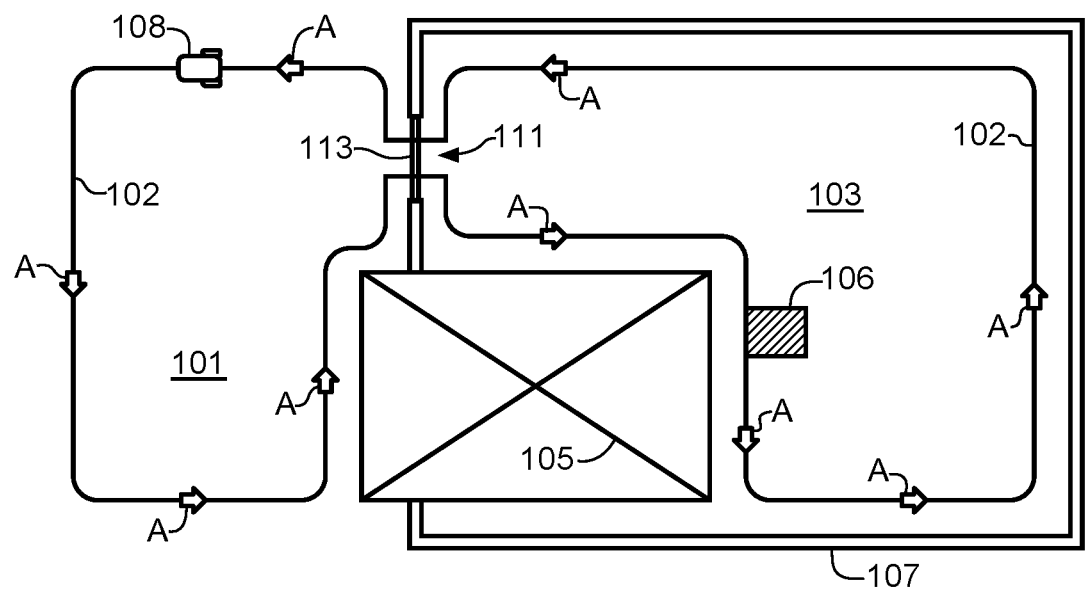
FIG. 1 is a plan view drawing of a perimeter wire arranged in a lawn areas adjacent a building, and according to an illustrative embodiment of the present invention.

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope hereof and additional fields in which the present invention would be of significant utility.

In considering the detailed embodiments of the present invention, it will be observed that the present invention resides primarily in combinations of steps to accomplish various methods or components to form various apparatus and systems. Accordingly, the apparatus and system components, and method steps, have been represented where appropriate by conventional symbols in the drawings, showing only those specific details that are pertinent to understanding the present invention so as not to obscure the disclosure with details that will be readily apparent to those of ordinary skill in the art having the benefit of the disclosures contained herein.

In this disclosure, relational terms such as first and second, top and bottom, upper and lower, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a" does not, without more constraints, preclude the existence of additional identical elements in the process, method, article, or apparatus that comprises the element.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Those skilled in the art may implement the described functionality with alternative components for other applications.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No clause element is to be construed under the provisions of 35 U.S.C. § 112, sixth paragraph, unless the element is expressly recited using the phrase "means for" or, in the case of a method clause, the element is recited using the phrase "step for."

While this written description contains many specifics, these should not be construed as limitations on the scope of what may be described, but rather as descriptions of particular embodiments of the subject matter. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially described as such, one or more features from a described combination can in some cases be excised from the combination, and the described combination may be directed to a sub-combination or variation of a sub-combination.

The Title, Background, Brief Description of the Drawings, Abstract, and Drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the described subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately described subject matter.

Systems and methods described herein are directed to a guidance system for maneuvering a vehicle through a doorway opening in a barrier while limiting the size of the opening and thereby the size of a door covering the opening. By limiting the size of the doorway, relatively smaller sized hardware and higher energy efficient motors may be used for opening and closing the door in the doorway opening. Further, such doors may be opened and closed in a relatively shorter time, thereby minimizing any security concerns due to open doorways.

In some illustrative embodiments, the vehicle is a robotic lawnmower, or a robotic mower, which operates autonomously, according to a pre-set route or according to remote control. The robotic mower may be powered by electric motors and propelled by wheels. The vehicle may also be other types of self-propelled vehicles, including robotic vacuum cleaners or transport vehicles for people, cargo or for providing other service functions.

The barriers discussed herein may be fences, walls, doors, hedgerows, or other obstacles. An automated doorway and door system of the present disclosure allows free movement of a robotic mower between different areas separated by the barriers, thus enabling the robotic mower to access remote lawn areas, multiple lawn areas, mower battery chargers and mower storage spaces. This range of movement enables fully automatic operation of the robotic mower in all of the lawn areas to be mowed, as well as accessing a battery charging station, and a safe storage location for the robotic mower.

Reference is directed to FIG. 1, which is a plan view drawing of a perimeter wire 102 arranged in a lawn areas adjacent a building 105, and according to an illustrative embodiment of the present invention. The perimeter wire 102 is arranged about a back lawn area 103 and a front lawn area 101. The back lawn area 103 is surrounded by a fence 107, which abuts a building 105, such as a home. There is a door opening 111 in the fence 107, and a door 113 in the doorway 111, which provided limited access between the front yard 101 and the back yard 103. The wire 102 is buried in the ground in both the back lawn area 103 and the front lawn area 101, and is arranged in a loop that extends between the front lawn area 101 and back lawn area 103 of a dwelling 105. The perimeter wire 102 may be electrically energized with a current and/or voltage flowing through the wire 102. A battery charging base 106 for charging a robotic mower 108 may be electrically connected to the wire 102 and located in the backyard 103. However, in other embodiments, the charging base 106 may be located in the front yard 101 and electrically connected to the wire 102 located in the front yard 101.

The wire 102 is used to guide an autonomous vehicle, which is robotic mower 108 in this embodiment, traveling between the front yard 101 and the backyard 103. For the purposes of discussions herein, the autonomous vehicle 108 is assumed to be a robotic lawn mower 108, also referred to as a "mower." However, as will be understood, the autonomous vehicle 108 may be any type of self-propelled vehicle, without departing from the scope of the disclosure. As indicated in FIG. 1 by the several arrows 'A', the mower 108 travels in the counterclockwise direction, as depicted, along the wire 102. However, in other embodiments, the mower 108 may travel in the clockwise direction between the front yard 101 and the backyard 103.

When the batteries in the mower 108 run low, the mower 108 needs to recharge it internal batteries at the battery charging base 106. In order to reach the battery charging base 106, the mower 108 'finds' the wire 102 and then follows the wire 102 along the counterclockwise path 'A' to the charging base 106. However, in other embodiments, the mower 108 may also travel in the clockwise direction.

In an illustrative embodiment, while following the wire 102, the mower 108 generally attempts to center itself over the wire 102 as it travels. Electronic circuitry in the mower 108 senses the presence of the wire 102 based on the current and/or voltage in the wire 102 and controls the mower 108 to follow the wire 102.

The wire 102 passes through the doorway 111 in two directions, which are referred to as inbound and outbound directions. A minimum separation is required between the inbound and outbound wires 102 at any point on the wire 102 in order for the mower 108 to distinguish between them and maintain travel along the desired path. For the purposes of discussion, inbound and outbound wires may be defined with reference to the travel direction of the mower 108. For instance, referring to the wire 102 the inbound wire may be the wire segment which the mower 108 follows to travel from the front yard 101 to the backyard 103 and the outbound wire may be the wire segment which the mower 108 follows to travel from the backyard 103 to the front yard 101. The salient point is that when the wire 102 is arranged near itself, such as through the doorway 111, a minimum separation is required for reliable navigation by the mower 108.

In the illustrative embodiment, the minimum separation distance required between the inbound and outbound wires is approximately eight to twelve inches. Adding this separation distance to the width of the mower 108, which may typically be approximately 24 inches, requires an opening that is approximately thirty-six inches. Accounting for other tolerances, the opening needs to be approximately thirty-eight to forty inches, and thusly requires a doorway 111 and door 113 at least that width. Considering that the mower 108 is just twenty-four inches wide, the door is quite large, and may become prohibitively large considering the requirements to automate the door's operation and the attendant access security issues. Clearly, it is desirable to have the doorway 111 having a relatively narrower width.

Figure 2:
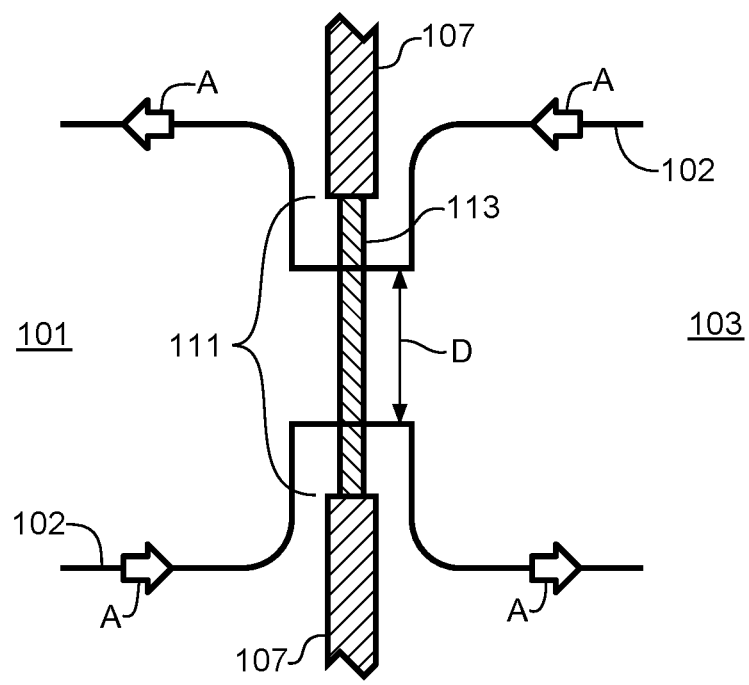
FIG. 2 is a drawing of a fence with an opening and door according to an illustrative embodiment of the present invention.

Reference is directed to FIG. 2, which is a drawing of a fence 107 with a doorway opening 111 and door 113 according to an illustrative embodiment of the present invention. FIG. 2 illustrates the fence 107 and the doorway 111 in relatively more detail. The doorway 111 must be wide enough for the mower 108 (not shown) to pass, but not so wide that the separation distance 'D' between the inbound and outbound wires would be less than the required minimum separation. If the separation distance D was less, it would become unreliable or even impossible to guide the robotic lawn mower 108 between the front yard 101 and the backyard 103 via the opening 111.

Embodiments presented herein disclose a ground wire guidance system that minimize the size of the doorway 111 and the door 113, thus permitting the mower 108 to pass therethrough even though the separation 'D' between the inbound and outbound wires in the opening 111 is less than the required minimum separation.

Figure 3:
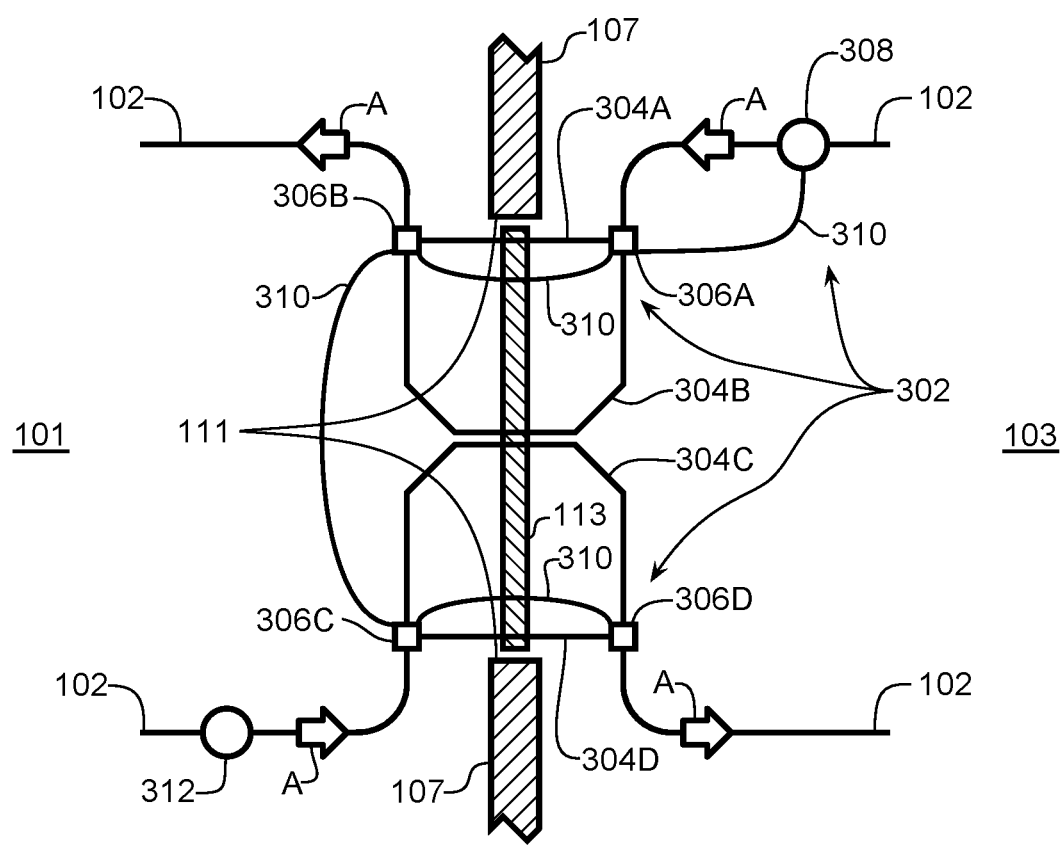
FIG. 3 is diagram illustrating a perimeter wire a guidance system about a doorway in a fence according to an illustrative embodiment of the present invention.

Reference is directed to FIG. 3, which is a diagram illustrating a perimeter wire 102 guidance system about a doorway 111 in a fence 107 according to an illustrative embodiment of the present invention. FIG. 3 schematically illustrates a switching system, generally 302, according to an illustrative embodiment. The switching system 302 includes switching components for reconfiguring the connection of the various wires 102, 304A, 304B, 304C, and 304D, so as to permit the mower 108 (not shown) to pass through the doorway 111. As illustrated, the switching system 302 is located about the doorway 111 and is be coupled to the perimeter wire 102. The switching system 302 includes a plurality of wires, identified by reference numbers 304A, 304B, 304C, and 304D, a plurality of switching devices identified with reference numerals 306A, 306B, 306C, and 306D, and a sensor and switching controller 308. In an illustrative embodiment, the switching devices 306A, 306B, 306C, and 306D may be relays, such electro-mechanical relays, latching relays, solid state relays, or the like. Using latching relays or solid state relays reduces power consumption of the switching system 302 because they do not require constant power to hold a given state. The sensor and switching controller 308 may be electrically connected to the perimeter wire 102 in the backyard 103 area and positioned such that the mower 108 following the perimeter wire 102 in the backyard 103 will actuate the sensor and switching controller 308.

As illustrated in FIG. 3, the wires 304A and 304B are connected between the switching devices 306A and 306B. The wire 304A is disposed adjacent the fence 107 on one side of doorway 111, while the wire 304B is disposed in U-shape extending between the switching devices 306A and 306B and near the center of the doorway 111. The wires 304C and 304D are connected between the switching devices 306C and 306D. The wire 304D is disposed adjacent the fence 107 on the other side of the doorway 111, while the wire 304C is disposed in U-shape extending between the switching devices 306C and 306D and near the center of the doorway 111. Since the perimeter wire 102 is a continuous conductor along its entire length (not shown), the wires 304B and 304C may not contact each other in the area along the center of the doorway 111. A control wire 310 electrically connects the sensor and switching controller 308 to all of the switching devices 306A, 306B, 306C, 306D. In this embodiment, the wires 304A and 304D are shielded so they are less likely to be detected by the mower (not shown), and thereby may be disposed adjacent wires 304B and 304C in the center of the doorway 111 without confusing the mower. As a result of the shielding, the switching system 302 may be made more compact and is easier to install.

In a default configuration of the illustrative embodiment, the switching devices 306A, 306B, 306C, and 306D are actuated such that the wires 304A and 304C are connected to the perimeter wire 102 in the front yard 101 and the backyard 103. While wires 304B and 304D are disconnected from the perimeter wire 102. Thus, the mower 108 (not shown) approaching from the front yard 101 follows wire 304C through the center of the opening 111 while the wires 304A and 304C remain separated by the minimum required distance discussed hereinbefore. On the other hand, if the mower 108 (not shown) approaches from the backyard 103 it actuates the sensor and switching controller 308. The sensor and switching controller 308 provides a switching signal to the switching devices 306A, 306B, 306C, and 306D via the control wire 310, so as to disconnect wires 304A and 304C and connect wires 304B and 304D to the perimeter wire 102. The mower 108 (not shown) then follows wire 304B through the center of the opening 111. The sensor and switching controller 308 may include a preset time that is actuated by the switching signal. After the timer elapses, another switching signal is provided to the switching devices 306 to reconnect wires 304A and 304C to the perimeter wire 102 and disconnect wires 304B and 304D from the perimeter wire 102, thusly returning to the default state. The preset time may depends on one or more of the speed of the mower 108, the time taken to actuate a locking mechanism to unlock the doorway, and the time taken for the doorway to open such that the mower 108 may pass.

As illustrated in FIG. 3, the switching system 302 also includes a door latch sensor 312 electrically connected to the perimeter wire 102 in the front yard 101. The door latch sensor 312 is positioned such that the mower 108 (not shown) follows the perimeter wire 102 in the front yard 101 and actuates the door latch sensor 312. When actuated, the door latch sensor 312 signals a controller in the doorway 113 or in the fence 107 (not shown) to direct a locking mechanism (not shown) to retract a pin, thus unlocking the door 113 and opening the doorway 111, and thereby enabling the mower 108 (not shown) to pass through the doorway 111. The default configuration in which the wires 304A and 304C are connected to the perimeter wire 102 is maintained since the sensor and switching controller 308 is not actuated. The door latch sensor 312 may provide the signal using a wired or wireless connection. The door latch sensor 312 may use Bluetooth technology, infrared signals, ultrasonic signals, radio signals, Radio Frequency Identification, optical signals, video signals or other electronic signals for communication. The sensor and switching controller 308 and/or the door latch sensor 312 may be battery operated.

As discussed above, the switching system 302 guides the mower 108 (not shown) through a narrow doorway 111, however other illustrative embodiment are not limited thereto. The switching system 302 may also guide or maneuver the mower 108, or other vehicles, through any narrow passage, path, or roadway, without departing from the scope of the disclosure. For instance, the guidance system 302 may guide the mower 108 (not shown) when traveling a relatively narrow path that connects two, or more, relatively large sized lawn areas.

Figure 4A:
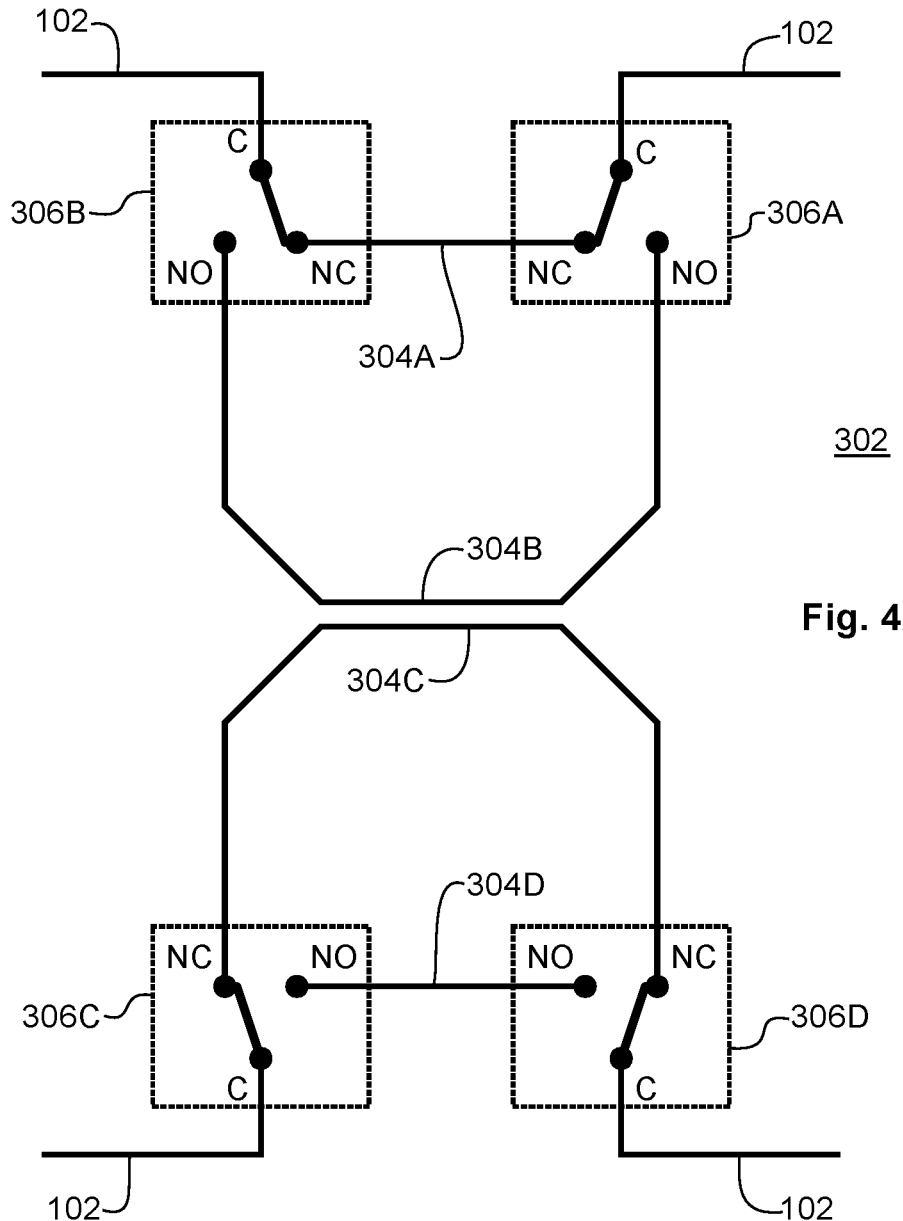
FIGS. 4A and 4B are electrical wiring diagrams of a perimeter wire switching system about a door in a fence according to an illustrative embodiment of the present invention.
Figure 4B:
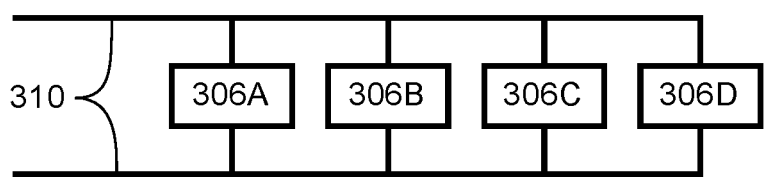

Reference is directed to FIGS. 4A and 4B, which are electrical wiring diagrams of a perimeter wire switching system 302 about a doorway (not shown) in a fence (not shown) according to an illustrative embodiment of the present invention. FIG. 4A illustrates an electrical connection of the wires 304A, 304B, 304C, and 304D and the switching devices 306A, 306B, 306D, and 306D of the switching system 302. Each switching device 306 is a relay having a normally closed "NC" connection, a normally open "NO" connection, and a common "C" connection. As illustrated, the switching system 302 is in the default configuration, wherein the wires 304A and 304C are connected to the perimeter wire 102. Upon energizing the relays 306A, 306B, 306D, and 306D, the states of all of them changes from NC to open, and from NO to closed, thusly rearranging the connection of the wires 304A, 304B, 304C, and 304D. The relays 306A, 306B, 306D, and 306D have magnetic coils, as will be appreciated by those skilled in the art, that are driven by control wires 310, and these connections are presented in FIG. 4B, with the respecting really reference numerals presented.

Considering the operation of the circuits presented in FIG. 4A, and with reference to FIG. 3 as well, it can be appreciated that in the normal state of the switching devices 306A, 306B, 306D, and 306D, wire 304C is connected to the perimeter wire 102 and is routed though the central portion of the doorway 111, and, wire 304A is also connected to the perimeter wire 102 circuit, but is routed along the edge of the doorway 111, and thus provide greater than the minimum separation between them. The mower 108 (not shown) can traverse the doorway 111 from the front yard 101 toward the back yard 103. Conversely, when the switching devices 306A, 306B, 306D, and 306D are powered by control sites 310, wire 304B is connected to the perimeter wire 102 and is routed though the central portion of the doorway 111, and, wire 304D is also connected to the perimeter wire 102 circuit, but is routed along the edge of the doorway 111, and thus provide greater than the minimum separation between them. The mower 108 (not shown) can traverse the doorway 111 from the back yard 103 toward the front yard 101.

Now referencing back to FIGS. 2 and 3, in an unlocked position of the door 113, a pin of the locking mechanism (not shown) of the doorway 111 is retracted by the locking mechanism and does not interfere with the operation of the door 113. The door 113 may be a swinging door or door with a hinge located at the top of the doorway 111. In a locked position, the pin is extended by the locking mechanism and is inserted into a pin receptacle (not shown) in the doorway 113, thus preventing an operation of the doorway 111. In some illustrative embodiments, the pin is longitudinally translated between the locked and unlocked, or extended and retracted, positions by a solenoid (not shown) or an electric motor (not shown) within the locking mechanism. A distal end of the pin, which first enters the pin receptacle in the doorway 113, may include a rounded, conical, pyramidal, pointed or frustum shape to aid the insertion of the pin into the pin receptacle.

In some implementations of the door 113 and doorway 111, the door 113 is externally powered and is rotatably or slidably moved out of the path of the mower 108. The door 113 and/or the mower 108 can, in some implementations, wirelessly communicate a current status, future plan, operational history or other information to a user, a network or a remote device using various wireless communication technologies.

Now considering the sensor and switching controller 308 and door latch sensor 312 in FIG. 3, the robotic mower, or other vehicle, may be detected using a wireless communication system. For example, the wireless communication system may include a magnetometer sensor system including a magnetometer sensor in the sensor and switching controller 308 and/or door latch sensor 312 for communicating with the door latch mechanism, and a magnet installed on the mower. A benefit of using the magnetometer sensor system, as disclosed herein, is that the magnetometer sensor system may detect objects, the mower in this embodiment, which may not always be located at a fixed distance from magnetometer sensor system. In this regard, it should be noted that the position of the magnetometer sensor may be stationary, such as located in the sensor and switching controller 308 and door latch sensor 312, while the object to be detected may be located at substantially varying distances from the magnetometer sensor, as in the case of the mower approaching such a sensor. It will thus be understood that the magnetometer sensor system, according to embodiments disclosed, may be used in any application where distances between the magnetometer sensor and the object to be detect are not fixed.

Figure 5:
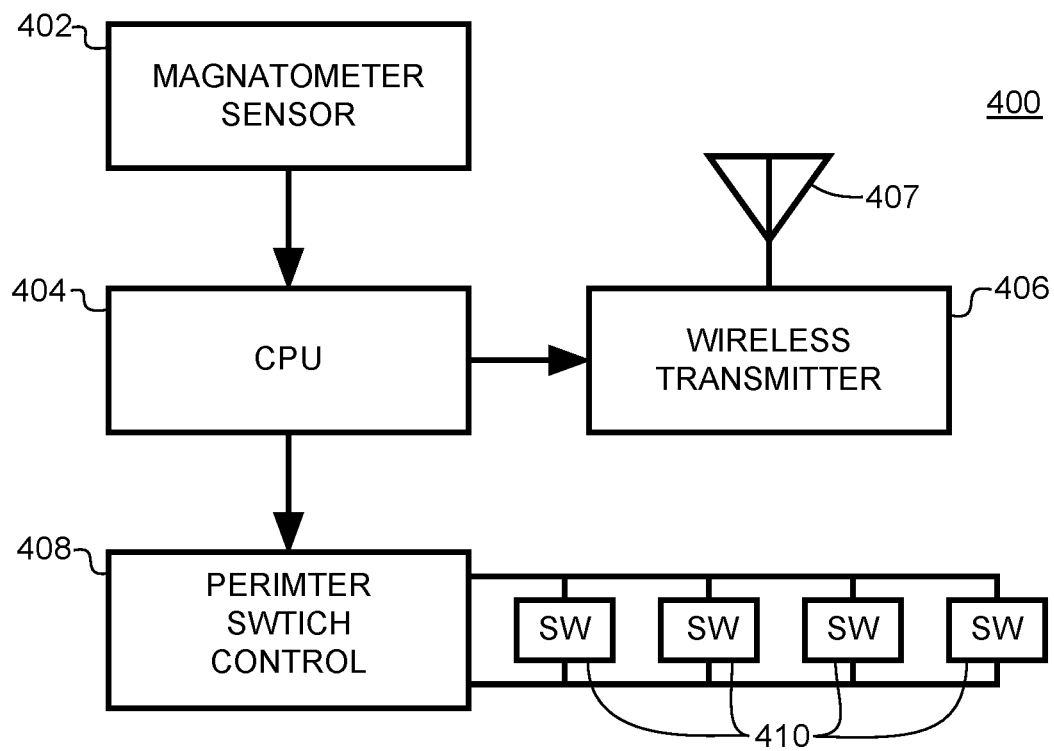
FIG. 5 is a functional block diagram of an in ground vehicle sensor according to an illustrative embodiment of the present invention.
Figure 6:
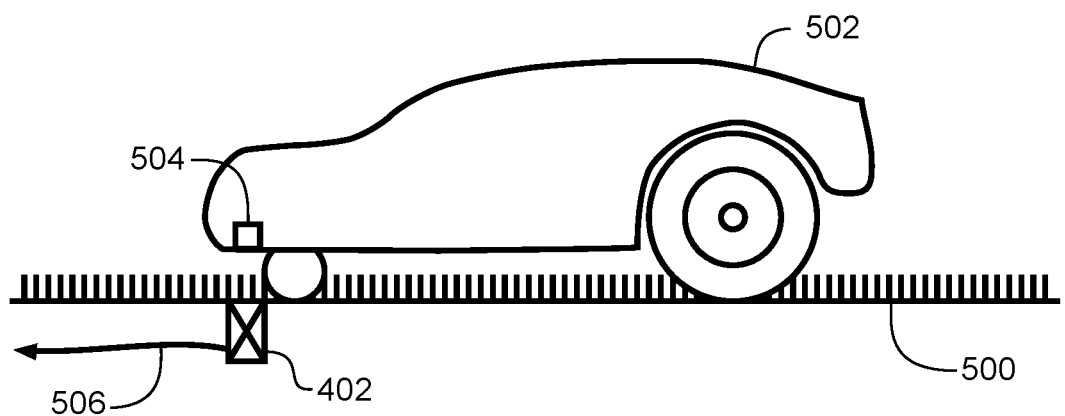
FIG. 6 is a drawing of a robotic mower engaging an in ground vehicle sensor according to an illustrative embodiment of the present invention.

Reference is directed to FIG. 5, which illustrates an exemplary magnetometer sensor system 400. The magnetometer sensor system 400 includes a magnetometer sensor 402, a processing unit 404, a wireless transmitter 406, having an antenna 407, and a perimeter switch controller 408. The permitter switch controller 408 is coupled to plural switching units 410 that may be used to route and reroute the perimeter wire connections (not shown). The magnetometer sensor 402 may be installed along, or adjacent to, the route taken by the robotic mower (not shown) to access the doorway, and thereby the door, as described hereinbefore. In an illustrative embodiment, the magnetometer sensor 402 may be installed in the ground in or along the route taken by the mower. The processing unit 404 receives a signal from the magnetometer sensor 402 indicative of the presence of the mower in the vicinity thereof. In an example, the magnetometer sensor 402 may be configured to sense the presence of the mower within a radius of about twelve inches from the magnetometer sensor 402. The processing unit 404 may process the received signal and actuate, or otherwise control, the wireless transmitter 406 to transmit a signal to a wireless receiver (not shown) mounted on the doorway and/or door (not shown) via an antenna 407. Upon receipt of the signal, the wireless receiver (not shown) instructs a controller in the doorway device to direct a locking mechanism to retract a pin, thus unlocking a door of the doorway device and enabling the mower to pass through the doorway. This process is more fully discussed hereinafter.

Continuing in FIG. 5, the processing unit 404 may also process the signal received from the magnetometer sensor 402 to generate a control signal for actuating, or otherwise controlling, the perimeter switch controller 408. Generally, in order to reach a charging base, such as item 106 in FIG. 1, the robotic mower 108 is configured to follow the charged perimeter wire 102, or other conductor, buried in the ground in a loop 102 as illustrated in FIG. 1. The wire may traverse multiple sections of the lawn area and, in instances, the charging base and the mower may be located in different sections of the lawn and may be separated from each other by the doorway. Thus, the mower pass through the doorway to reach the charging base.

As discussed hereinbefore, the inbound and outbound wires in the perimeter loop must be spaced a certain distance from each other to prevent incorrect operation due to crosstalk, interference, and the like. However, the spacing between the wires in the doorway may be reduced due to the size of the doorway. Additional switching wires are connected to the perimeter wire near the doorway to maintain the separation between the inbound and outbound wires. Based on the control signal, the perimeter switch controller 408 actuates appropriate switches 410 to switch wires such that the required separation is maintained between the inbound and outbound wires near the doorway.

In an illustrative embodiment, magnetometer sensor 402 is buried in the ground in the vicinity of the doorway. Reference is directed to FIG. 5, which illustrates the robotic mower 502 and the magnetometer sensor 402 installed in the ground 500. A magnet 504, such as a rare earth magnet, is installed underneath the mower 502 such that the magnet 504 can be detected by the magnetometer sensor 402 buried in the ground 500 when the magnet 504 is within a certain distance of the magnetometer sensor 402. The magnetometer is connected by conductor 506 to the processing unit. However, the location of the magnet 504 on the mower 502 is not limited to a particular location, and the magnet 504 may be installed at any location on the mower as long as the magnet 504 can be detected by the magnetometer sensor 402.

The magnetometer sensor 402 can be battery operated and it can be incased in a waterproof enclosure (not shown) to protect the magnetometer sensor 504. One or more other components of the magnetometer sensor system 400 may be located remote from the magnetometer sensor 402 or may be located with the magnetometer sensor 402. For instance, the processing unit 404 and the perimeter switch controller 408 may be incased in the enclosure along with the magnetometer sensor 402, while the wireless transmitter 406 may be at an above ground location. The wireless transmitter 406 may successfully send a wireless signal that is received by the wireless receiver at a certain maximum distance, which may be approximately 5-10 feet in an illustrative embodiment.

The processing unit 404 may be configured with the base values of the magnetic field in the X, Y, and Z planes, also referred to magnetic planes, as detected by the magnetometer sensor 402 in the absence of the magnet 504. The presence of the magnet 504 within a certain distance of the magnetometer sensor 402 causes a change in the magnetic field detected by magnetometer sensor 402 and a corresponding signal is transmitted to the processing unit 404 indicating a change in the magnetic field and thereby the presence of the mower 502. In response, the processing unit 404 commands the wireless transmitter 406 to transmit a signal to the wireless receiver mounted on the doorway device (not shown). The doorway of the doorway device is then opened for the mower 502 to pass through.

The doorway device (not shown) includes, in some illustrative embodiments, a wireless receiver, a locking mechanism, a door, a controller and a battery. The locking mechanism includes a selectively positionable pin. In an unlocked position, the pin is retracted by the locking mechanism and does not interfere with the operation of the door. The door can be a swinging door or a door with a hinge located at the top of the doorway. In a locked position, the pin is extended by the locking mechanism and is inserted into a pin receptacle in the door, thus preventing an operation of the door. In some implementations, the pin is longitudinally translated to the locked and unlocked, or extended and retracted, positions by a solenoid or an electric motor within the locking mechanism. A distal end of the pin, that first enters the pin receptacle in the doorway, may include a rounded, conical, pyramidal, pointed or frustum shape to aid the insertion of the pin into the pin receptacle.

Figure 7:
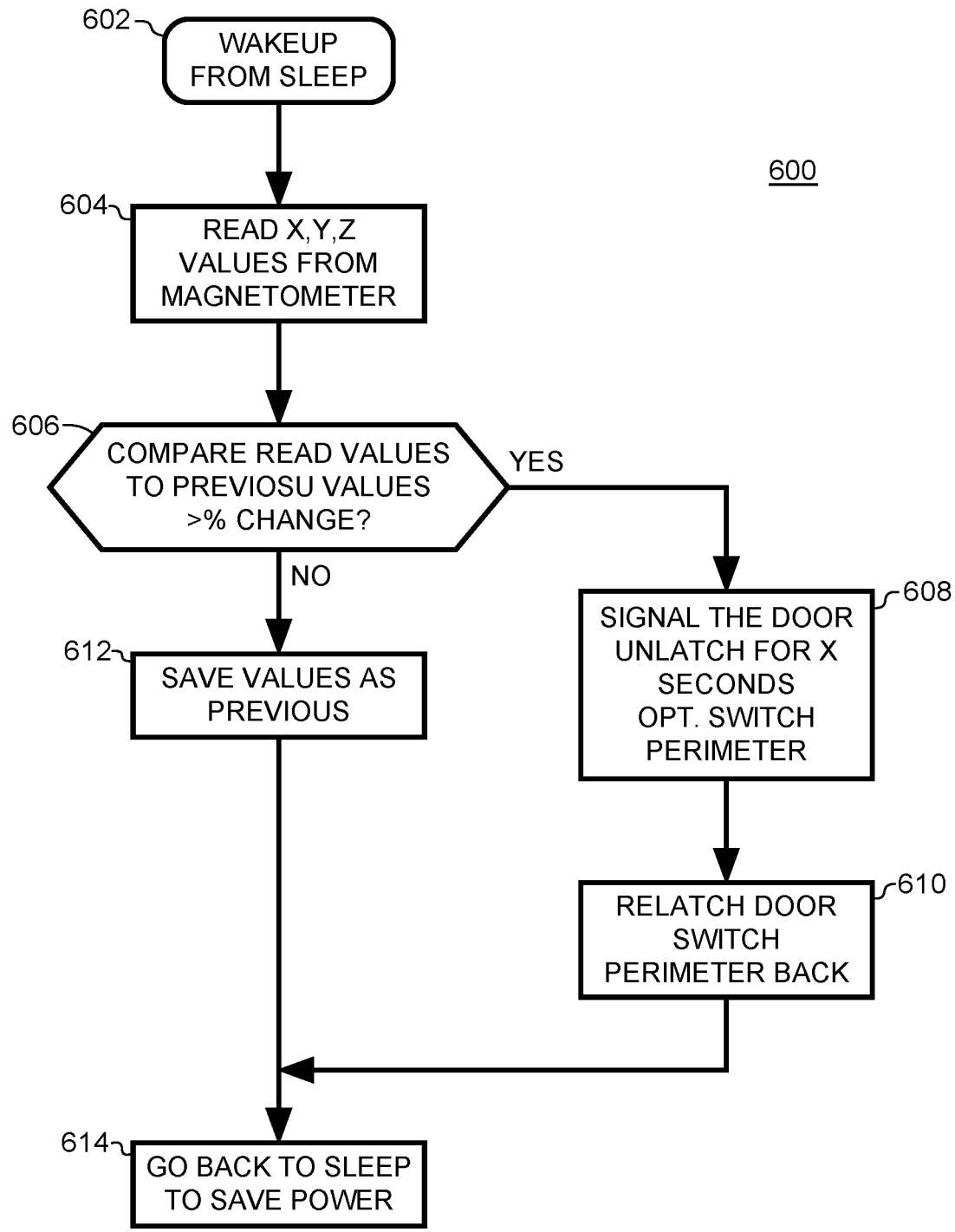
FIG. 7 is a functional block diagram of a door latch sequence according to an illustrative embodiment of the present invention.

Reference is directed to FIG. 7, which is a flowchart of the door operation according to an illustrative embodiment of the present disclosure. FIG. 7 illustrates a method 600 of permitting access by the mower to the door and doorway. As illustrated, the method 600 begins with the processing unit 404 waking up from a sleep at step 602. The processing unit 404 checks, at regular or desired pre-programmed intervals, for a signal from the magnetometer sensor 402, at step 604. The signal may includes the X, Y, and Z values of the magnetic field detected by the magnetometer sensor. At step 606, the processing unit compares the X, Y, and Z values with the stored base X, Y, and Z values and determines the difference therebetween. If the difference is above a predetermined threshold, then at step 608, the processing unit commands the wireless transmitter to send a signal to the wireless receiver of the doorway device to open the door. In an illustrative embodiment, the door is kept opened for a pre-determined time period, which is long enough for the mower to pass.

Additionally, at step 608, the processing unit commands the perimeter switch controller to select the appropriate switching wires. As discussed above, the switching wires can be selected by selectively activating relays connected thereto. At step 610, after the pre-determined time period has expired, doorway is closed and locked. In addition, the processing unit unselect the switching wires. At step 614, the processing unit re-enters the sleep mode and the process ends.

At 606, if the difference between the X, Y, and Z values read from the magnetometer sensor and the stored base X, Y, and Z values is below a pre-determined threshold, then at step 612, the most recently received values of the magnetic field are stored and the method proceeds to step 614.

In some illustrative embodiments, the wireless receiver, locking mechanism, controller, battery and a door closing-sensor are located in or on the doorway or door. In such an implementation, the pin is longitudinally translated from the doorway into a pin receptacle in the doorway device, thus preventing an operation of the doorway. Other functionality and features of these implementations are the same as those described above in other implementations.

The disclosed systems and methods can be implemented with a computer system known to one of ordinary skill in the art, using, for example, software, hardware, or a combination of both, either in a dedicated server, or integrated into another entity, or distributed across multiple entities. An exemplary computer system includes a bus or other communication mechanism for communicating information, and a processor coupled with the bus for processing information. The processor may be locally or remotely coupled with the bus. By way of example, the computer system may be implemented with one or more processors. The processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. The computer system also includes a memory, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus for storing information and instructions to be executed by processor. The instructions may be implemented according to any method well known to those of skill in the art, including, but not limited to, computer languages such as data-oriented languages (e.g., SQL, dBase), system languages (e.g., C, Objective-C, C++, Assembly), architectural languages (e.g., Java), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, wirth languages, and xml-based languages. Memory may also be used for storing temporary variable or other intermediate information during execution of instructions to be executed by processor. The computer system further includes a data storage device such as a magnetic disk or optical disk, coupled to bus for storing information and instructions. The computer system may be coupled via communications module to various devices. The communications module can be any input/output module. In certain implementations, the communications module is configured to connect to a plurality of devices, such as an input device and/or an output device.

According to one aspect of the present disclosure, the disclosed system can be implemented using a computer system in response to a processor executing one or more sequences of one or more instructions contained in memory. Such instructions may be read into memory from another machine-readable medium, such as data storage device. Execution of the sequences of instructions contained in main memory causes the processor to perform the process steps described herein. One or more processors in a multi-processing arrangement may also be employed to execute the sequences of instructions contained in memory. In alternative implementations, hard-wired circuitry may be used in place of or in combination with software instructions to implement various implementations of the present disclosure. Thus, implementations of the present disclosure are not limited to any specific combination of hardware circuitry and software. According to one aspect of the disclosure, the disclosed system can be implemented using one or many remote elements in a computer system (e.g., cloud computing), such as a processor that is remote from other elements of the exemplary computer system described above.

The term "machine-readable medium" as used herein refers to any medium or media that participates in providing instructions to the processor for execution. Such a medium may take many forms, including, but not limited to, non-volatile media, volatile media, and transmission media. Non-volatile media include, for example, optical or magnetic disks, such as a data storage device. Volatile media include dynamic memory, such as memory. Transmission media include coaxial cables, copper wire, and fiber optics, including the wires that comprise the bus. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A ground wire guidance system for guiding a robotic vehicle through a doorway in a barrier, comprising:
   a ground wire loop arranged to pass though the doorway in both a first direction and a second direction, and wherein said ground wire arranged in said first direction is split adjacent the doorway with a first end coupled to a first switch and a second end coupled to a second switch, and wherein said ground wire arranged in said second direction is split adjacent the doorway with a third end connected to a third switch and a fourth end coupled to a fourth switch;

a first and second wire, each connected between said first switch and said second switch, and wherein said first wire is routed through a central portion of the doorway, and said second wire is routed through the doorway in a manner that enables navigation by the robotic vehicle along said first wire;

a third and fourth wire, each connected between said third switch and said fourth switch, and wherein said fourth wire is routed through a central portion of the doorway, and said third wire is routed through said doorway in a manner that enables navigation by the robotic vehicle along said fourth wire;

a controller coupled to each of said first, second, third, and fourth switches to switch between a default state and a switched state, and wherein said default state couples said first wire between said first and second switches, and couples said third wire between said third and fourth switches, and, said switched state couples said second wire between said first and second switches, and couples said fourth wire between said third and fourth switches, to thereby provide that only a single one of said second wire and said third wire is connected to said ground wire loop in either of said default state or said switched state.

2. The system of claim 1, and wherein:
said first and fourth wires are routed through the doorway a distance away from the central portion of the doorway that is selected to provide a minimum separation therebetween for navigation by the robotic vehicle.

3. The system of claim 1, and wherein:
said first and fourth wires are shielded to provide navigation by the robotic vehicle along either of said second or third wires.

4. The system of claim 1, further comprising:
a sensor disposed adjacent the doorway, operable to detect an approaching vehicle, and output a detention signal to said controller, and wherein
said controller, upon receipt of said detection signal, switches from said default state to said switched state.

5. The system of claim 4, and wherein:
said controller reverts from said switched state back to said default stated after a predetermined period of time.

6. The system of claim 4, wherein the robotic vehicle has a magnet fixed thereto, and wherein:
said sensor is a magnetometer responsive to the magnet in the robotic vehicle.

7. The system of claim 1, and wherein a door is disposed within the doorway of the barrier, and further comprising:
a door latch sensor disposed adjacent the doorway, operable to detect an approaching vehicle, and coupled to unlock a door locking mechanism on the door upon detection of the approaching vehicle.

8. The system of claim 7, and wherein:
said door latch sensor outputs a door latch signal to said controller, and wherein
said controller changes the state of said first, second, third, and fourth switches in response to said door latch signal.

9. The system of claim 8, and wherein:
said door latch signal is wirelessly communicated to said controller and to said door locking mechanism.

10. The system of claim 1, and wherein:
said first, second, third, and fourth switches are single-pole, double-throw relays.

11. A method of guiding a robotic vehicle through a doorway in a barrier using a ground wire loop arranged to pass though the doorway in both a first direction and a second direction, comprising the steps of:
splitting the ground wire arranged in the first direction adjacent the doorway and coupling a first switch to a first end thereof, and coupling a second switch to a second end thereof;
splitting the ground wire arranged in the second direction adjacent the doorway and coupling a third switch to a third end thereof, and coupling a fourth switch to a fourth end thereof;
connecting a first and second wire between the first switch and the second switch, and routing the first wire through a central portion of the doorway, and routing the second wire through the doorway in a manner enabling navigation by the robotic vehicle along the first wire;
connecting a third and fourth wire between the third switch and the fourth switch, and routing the fourth wire through a central portion of the doorway, and routing the third wire through the doorway in a manner enabling navigation by the robotic vehicle along the third wire;
coupling the first, second, third, and fourth switches to to a controller for switching between a default state and a switched state;
activating the default state, thereby coupling the first wire between the first and second switches, and coupling the third wire between the third and fourth switches;
activating the switched state, thereby coupling the second wire between the first and second switches, and coupling the fourth wire between the third and fourth switches, and thereby
providing that only a single one of the second wire and the third wire is connected to the ground wire loop in either of the default state or the switched state.

12. The method of claim 11, and wherein:
said routing the first and fourth wires steps include routing through the doorway by selecting a distance away from the central portion of the doorway, and thereby providing provide a minimum separation from the second and third wires, respectively, for navigation by the robotic vehicle.

13. The method of claim 11, further comprising the steps of:
shielding the first and fourth wires, thereby providing navigation by the robotic vehicle along either of the second or third wires.

14. The method of claim 11, further comprising the step of:
disposing a sensor adjacent the doorway;
detecting an approaching vehicle by the sensor, and outputting a detention signal, and
switching from the default state to the switched state in response to the detection signal.

15. The method of claim 14, further comprising the step of:
reverting from the switched state back to the default stated after a predetermined period of time.

16. The method of claim 11, and wherein a door having a door locking mechanism attached thereto is disposed within the doorway of the barrier, and a door latch sensor is disposed adjacent the doorway, and further comprising the steps of:

detecting an approaching vehicle by the door latch sensor, and unlocking the door locking mechanism upon detecting of the approaching vehicle.

17. The method of claim 16, further comprising the steps of:

outputting a door latch signal by the door latch sensor, and
   changing the state of said first, second, third, and fourth switches in response to the door latch signal.

18. A system for guiding a vehicle, comprising:

a plurality of switching wires, including a first switching wire, a second switching wire, a third switching wire, and a fourth switching wire;
   a plurality of switching devices, including a first switching device, a second switching device, a third switching device, and a fourth switching device;
   a perimeter wire electrically connected to each of the plurality of switching devices, and
   a controller electrically connected to each of said plurality of switching devices, and wherein
   said first switching wire and said second switching wire are electrically connected to each of said first switching device and said second switching device, and wherein
   said third switching wire and said fourth switching wire are electrically connected to each of the third switching device and the fourth switching device, and wherein
   said second switching wire and fourth switching wire extend away from said first switching wire and said third switching wire, respectively.

19. The system of claim 18, wherein the system is disposed about an opening in a barrier, and wherein:

said second switching wire and said fourth switching wire extend away from said first switching wire and said third switching wire, respectively, towards a central portion of the opening.

20. The system of claim 18, and further comprising:

a sensor electrically connected to each of the plurality of switching devices.

* * * * *